(12) United States Patent
Watson

(10) Patent No.: US 7,411,465 B2
(45) Date of Patent: Aug. 12, 2008

(54) AGC CIRCUIT FOR THE REDUCTION OF HARMONICS IN THE DRIVE SIGNAL

(75) Inventor: William S. Watson, Eau Claire, WI (US)

(73) Assignee: Watson Industries, Inc., Eau Claire, WI (US)

( * ) Notice: Subject to any disclaimer, the term of this patent is extended or adjusted under 35 U.S.C. 154(b) by 391 days.

(21) Appl. No.: 11/182,619

(22) Filed: Jul. 15, 2005

(65) Prior Publication Data

US 2007/0052456 A1    Mar. 8, 2007

(51) Int. Cl.
H03B 5/30    (2006.01)
H01L 41/00    (2006.01)

(52) U.S. Cl. .................. 331/154; 73/504.12; 310/318

(58) Field of Classification Search .............. 331/154; 73/504.12; 310/318
See application file for complete search history.

(56) References Cited

U.S. PATENT DOCUMENTS

| | | | |
|---|---|---|---|
| 3,659,175 A * | 4/1972 | Sordello .................. 318/696 |
| 3,979,715 A | 9/1976 | Hufstedler et al. |
| 3,988,659 A | 10/1976 | Ambrosini |
| 3,994,016 A * | 11/1976 | Moghadam .............. 360/77.02 |
| 4,157,041 A | 6/1979 | Loper, Jr. et al. |
| 4,479,098 A | 10/1984 | Watson |
| 4,511,848 A | 4/1985 | Watson |
| 4,578,650 A | 3/1986 | Watson |
| 4,595,960 A * | 6/1986 | Hamalainen et al. ..... 360/77.17 |
| 4,628,734 A | 12/1986 | Watson |
| 4,655,081 A | 4/1987 | Burdess |
| 4,674,331 A | 6/1987 | Watson |
| 4,700,056 A * | 10/1987 | Silvy et al. ............... 369/44.28 |
| 5,226,321 A | 7/1993 | Varnham et al. |
| 5,270,648 A | 12/1993 | Watson |
| 5,272,922 A | 12/1993 | Watson |
| 5,329,269 A | 7/1994 | Watson |
| 5,430,342 A | 7/1995 | Watson |
| 5,440,817 A | 8/1995 | Watson et al. |
| 5,469,414 A | 11/1995 | Okamura |
| 5,802,728 A | 9/1998 | Karnick et al. |

(Continued)

OTHER PUBLICATIONS

Gao, Z., et al. A Vibratory Wheel Micromachined Gyroscope, Symposium Gyro Technology, pp. 9.0-9.10 (1998).

(Continued)

*Primary Examiner*—Robert J. Pascal
*Assistant Examiner*—Levi Gannon
(74) *Attorney, Agent, or Firm*—Patterson, Thuente, Skaar & Christensen, P.A.

(57) ABSTRACT

A drive circuit apparatus for use in generating a drive signal for energizing an actuator about a natural resonant frequency is disclosed. The circuit has a counter that generates a count sequence derived from a drive sense signal. Additionally, a demodulator is further coupled to the counter and generates a voltage level signal from the drive sense signal based on the count sequence. A digital to analog (D/A) converter is coupled to both the counter and demodulator. The D/A converter generates the drive signal in a substantially constant phase relationship with respect to the drive sense signal as derived from the voltage level signal and based on the count sequence. In addition, a method of generating a drive signal for energizing an actuator about a natural resonant frequency is provided.

17 Claims, 3 Drawing Sheets

U.S. PATENT DOCUMENTS

| | | | |
|---|---|---|---|
| 5,889,670 A * | 3/1999 | Schuler et al. | ............... 700/83 |
| 6,272,925 B1 | 8/2001 | Watson | |
| 6,550,329 B1 | 4/2003 | Watson | |
| 6,801,028 B2 | 10/2004 | Kernahan et al. | |
| 6,845,667 B1 | 1/2005 | Watson | |
| 2005/0195511 A1 | 9/2005 | Sano et al. | |

OTHER PUBLICATIONS

Fell, C., et al. A Second Generation Silicon Ring Gyroscope, Symposium Gyro Technology, pp. 1.0-1.14 (1999).

Pierce, Ch. The Performance and Future Development of a MEMS SiVSG and its Application to the SiIMU, Symposium Gyro Technology, pp. 6.0-6.10 (2001).

Gaiβer, A., et al. Digital readout Electronics for Micro-Machined Gyroscopes with Enhanced Sensor Design, Symposium Gyro Technology, pp. 5.0-5.11 (20020.

Pearce, The Performance and Future Development of a MEMS SiVSG and its Application to the SiIMU, *BAE Systems*, 2001, Symposium Gyro Technology, pp. 6.0-6.10.

Gao et al., *A Vibratory Wheel Micromachined Gyroscope, Tsinghua University*, 1998, Symposium Gyro Technology, pp. 9.0-9.10.

Link et al., Digital Readout Electronics for Micro-Machined Gyroscopes with Enhanced Sensor Design, *HSG-IMIT*, University Stuttgart, Tshinghua University, 2002, Symposium Gyro Technology, pp. 5.0-5.11.

Fell et al., A Second Generation Silicon Ring Gyroscopes, *British Aerospace Systems & Equipment Ltd.*, 1999m Symposium Gyro Technology, pp. 1.0-1.14.

* cited by examiner

AGC CIRCUIT FOR THE REDUCTION OF HARMONICS IN THE DRIVE SIGNAL

FIELD OF THE INVENTION

The present invention relates generally to electronic drive circuits, and more particularly to an automatic gain control (AGC) circuit for driving actuator/mass combinations in optimum and controlled resonances over a wide range of frequencies.

BACKGROUND OF THE INVENTION

Instrumentation sensors operating on a principle of vibration of constrained actuator masses are known in the art. Unlike gyroscopic instrumentation sensors, these sensors require no rotating parts. Vibrating actuator masses may take a number of different configurations such as forks, bars, plates, rings, or cups using piezoelectric or electromagnetic operation.

The principle of operation underlying vibratory mass instrumentation sensors is relatively simple. If the mass is vibrated or maintained in oscillation along the same direction as its guiding structural constraint, the mass will not apply any force (other than its own weight) in a direction transverse to the guide. This remains true so long as the guide structure maintains a constant orientation in space. However, if a guide is forced to rotate about an axis at right angles to itself, the oscillating member will apply alternating or pulsating forces to the guide structure. In this case, the average magnitude of the force will be proportional to the angular velocity of the forced rotation. Such forces can be measured by sensors such as piezoelectric structures. The forces exerted by the oscillating actuator mass on the sensor structure causes measurable electrical potential signals to be developed on the faces of the sensor structure. These signals can then be measured and calibrated to the rate of turn of the sensor instrument.

A drive circuit is required for such vibratory mass instrumentation systems. The drive circuit establishes and maintains the vibrating or oscillatory state of the actuator mass at an optimum level throughout the operative period of the instrument. Generally in such instrumentation, it is most desirable to vibrate the actuator mass at the natural resonance of the desired oscillatory mode. However, there are several resonant modes that may be close in frequency to the desired mode in most configurations. The usual means of allowing only one frequency of oscillation to be driven is to include a phase locked loop in the drive circuit. The phase locked loop serves as a bandpass filter with a substantially constant phase relationship to the sensed drive motion. The typical phase locked loop is digital in nature and will provide a square wave output. This square wave drive signal is rich in higher harmonics and will excite higher frequency resonant modes, which will interfere with the desired oscillatory mode.

Early designs of drive circuits commonly used square wave signals at adjustable frequencies based on the sensed drive signal. This caused transitional current or voltage spikes in the control signal that could not be adequately suppressed through conventional filtering techniques. These were subsequently abandoned for the more smooth transition of triangular or sinusoidal drive signals. Additionally, improved mass structures such as monolithic crystals and subsequent cup-style oscillator gyros have led to improvements in minimizing the differences between the drive element and the sensing element.

Commonly applied designs known in the art provide the drive circuit feedback signal by using a phase locked loop to generate the oscillations from the drive sense signal. This oscillation signal is further processed by a wave shaping device such as a switched integrator, providing a triangular shaped drive signal. Although this method provides improved transitions between oscillations, there is still a significant chance of generating harmonics resulting in unwanted vibrations in the drive mechanism. Subsequent filtering techniques tend to add complexity, and cost to the design and are not very effective at eliminating the harmonics. Therefore, a need exists for an electronic circuit that can generate a smooth oscillatory drive signal from the drive sense signal while maintaining substantially the same phase relationship. In addition such a circuit should have relatively low complexity and low cost.

The present invention provides a solution to this and other problems known in the art, and offers other advantages over the prior art.

SUMMARY OF THE INVENTION

The present invention relates to electronic drive circuits that have a sine wave weighted multiplying digital to analog converter that generates an analog drive control signal derived from a phase locked loop and a demodulated derivation of the drive sense signal with an adjustable phase shift capability which solve the above-mentioned problem.

In accordance with one preferred embodiment of the present invention, a drive circuit apparatus for use in generating a drive signal for energizing an actuator about a natural resonant frequency is disclosed. The circuit has a counter that generates a count sequence derived from a drive sense signal. Additionally, a demodulator is further coupled to the counter and generates a voltage level signal from the drive sense signal based on the count sequence. A digital to analog (D/A) converter is coupled to both the counter and demodulator to digitally produce a reasonable approximation of a sine wave as derived from the voltage level signal and based on the count sequence. This digitally produced sine wave can be utilized as a drive signal that requires little or no filtering. The D/A converter generates the drive signal having a substantially constant phase relationship with respect to the drive sense signal. The digital generation of the sine wave allows the phase of that signal to be set at a constant phase relationship with a full range of phase settings.

Additional advantages and features of the invention will be set forth in part in the description which follows, and in part, will become apparent to those skilled in the art upon examination of the following or may be learned by practice of the invention.

DETAILED DESCRIPTION

Numerous vibration based gyro drive sense systems exist, however the current systems available fail to meet the more stringent tolerances, such as those driven by improved mass structures and cup-style oscillator gyros, which require low harmonics with a simple and economical design. The present invention will be described in preferred embodiments and is not intended to be limited as described.

Figure 1:
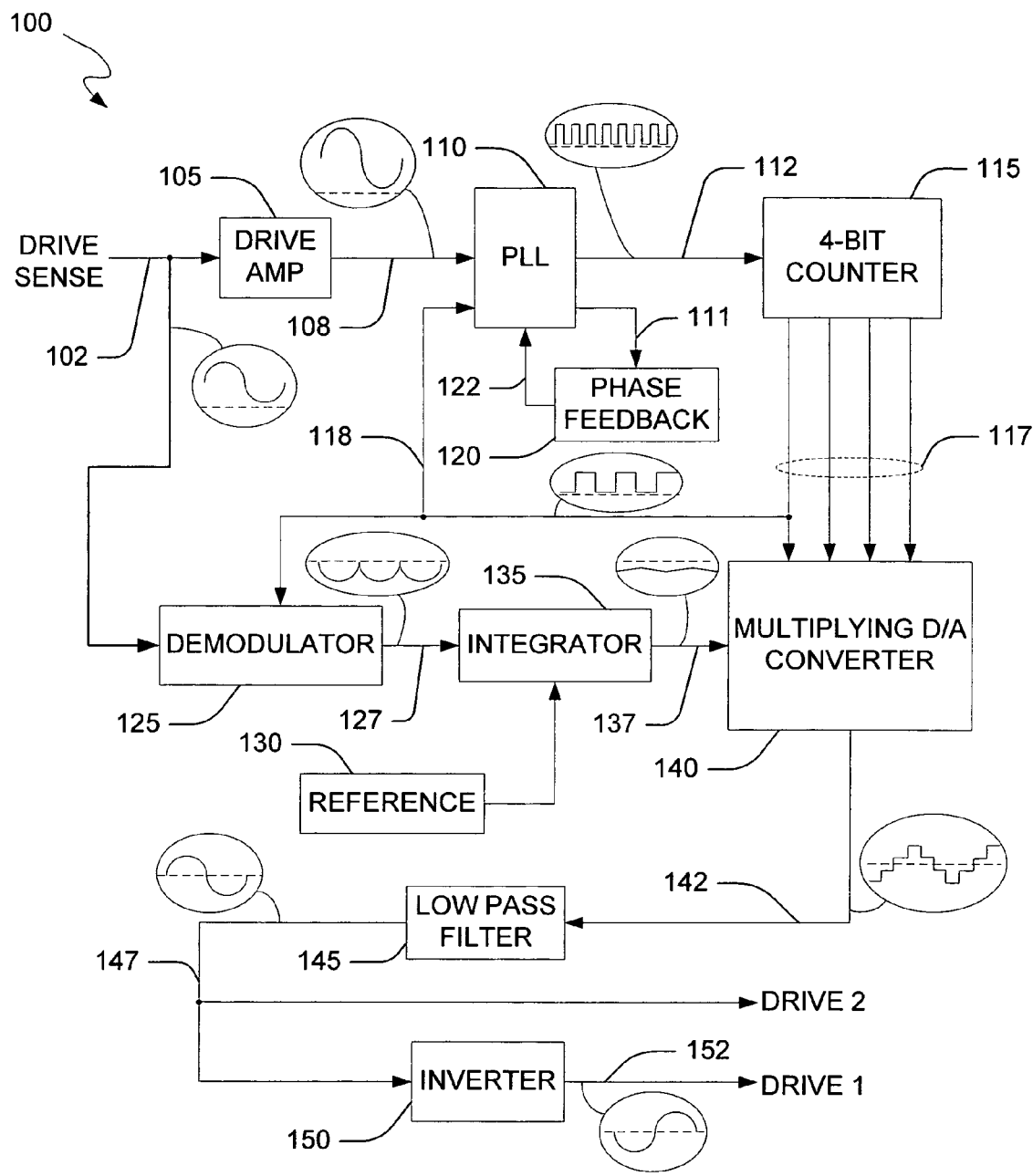
FIG. 1 is a block diagram of a drive circuit having low harmonics and low phase shift properties.

FIG. 1 is a block diagram of one embodiment of the present invention. The drive circuit apparatus 100 is used to generate a drive signal for energizing an actuator about a natural resonant frequency, based upon a received drive sense signal 102. The drive sense signal 102 is amplified by drive amp 105 to increase the rise time and fall time of the signal to make it more suitable for the phase locked loop. The amplified drive sense signal 108 is transmitted to the phase locked loop 110. The phase locked loop 110 generates a clock signal 112 that maintains a frequency in proportion to that of the amplified drive sense signal 108. The clock signal 112 from the phase locked loop 110 is transmitted to a counter 115 that generates a count sequence 117 derived from the drive sense signal 102. One bit 118 from the counter 115 is transmitted to the phase locked loop 110 for purposes of tracking the phase of the clock signal 112 to the amplified drive sense signal 108 as it is received by the phase locked loop 110. Additionally, the phase feedback 120 receives the phase information signal 111 from the phase locked loop 110 and provides a phase tracking signal 122 which is fed back to the phase locked loop 110 as part of the tracking feature of the phase locked loop 110. This will lock the phase of the phase lock oscillator to allow the counter 115 to be constant with respect to the amplified drive sense signal 108.

A demodulator 125 receives the drive sense signal 102, similarly as transmitted to the drive amp 105. The demodulator 125 is further controlled by one bit 118 from the output of the counter 115 and produces a negative rectified sine wave signal 127 that is derived from the drive sense signal 102 and transmitted to the integrator 135. The reference 130 offsets the negative rectified sine wave, allowing the integrator 135 to collect the difference between an average value of the drive sense signal 102 and the reference 130, producing a substantially constant signal 137.

A multiplying digital to analog converter (D/A) 140 receives the transmitted count sequence 117 from the counter 115 and the substantially constant signal 137 from the integrator 135. The D/A 140 generates a substantially bipolar stepped sinusoidal signal 142 that is proportional to the substantially constant signal 137 and is further transmitted to the low pass filter 145 which smoothes the edges of the substantially bipolar stepped sinusoidal signal 142. This produces a substantially sinusoidal signal 147 that is derived from the drive sense signal 102 and substantially fixed and constant in phase with the drive sense signal 102. The driver buffer 150 receives the substantially sinusoidal signal 147 and produces the shifted substantially sinusoidal signal 152 which is preferably one hundred eighty degrees phase shifted from the drive sense signal 102.

Figure 2:
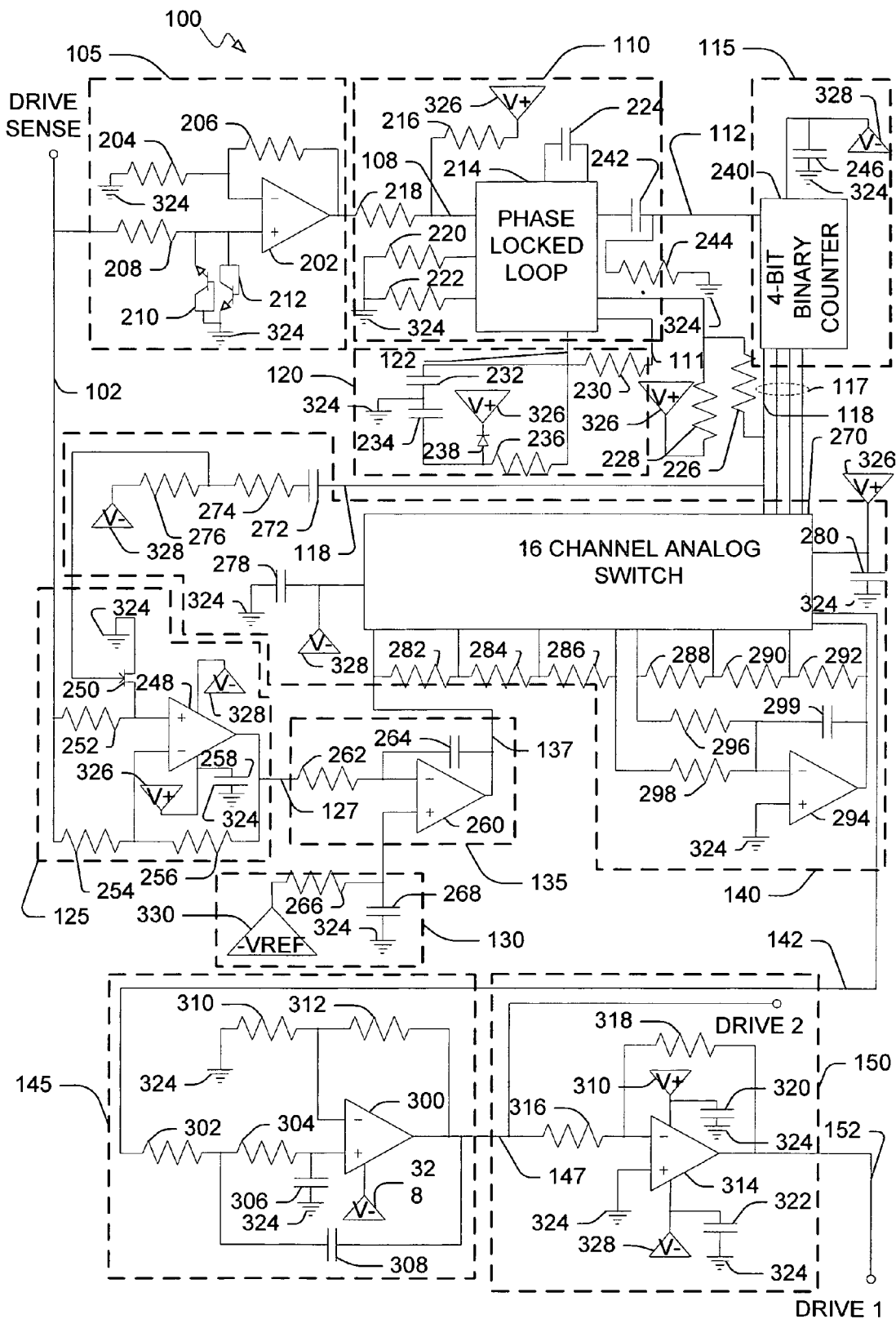
FIG. 2 is a schematic diagram of the drive circuit block diagram of FIG. 1.

FIG. 2 is detailed schematic diagram of one preferred embodiment of the drive circuit block diagram of FIG. 1. The drive circuit apparatus 100 is used to generate a drive sense signal 102 for energizing an actuator about a natural resonant frequency, based upon a received drive sense signal 102. The drive sense signal 102 is amplified by drive amp 105, which clips the peaks of the signal and amplifying the result to produce an amplified drive sense signal 108. This conditioning of the drive sense signal 102 improves stability of the phase locked loop 110 by ensuring a signal with greater magnitude at the zero crossing point, thus removing phase noise. This configuration further includes an operational amplifier 202 that is preferably a high-impedance, low signal noise matched amplifier set similar to the TLC2274, manufactured by Texas Instruments, Dallas, Tex. The values of resistors 204 and 206 may be selected to produce the desired gain of the amplifier 202. In one preferred embodiment, the value of resistor 206 is chosen as 402 k ohms (ten percent tolerance) and resistor 204, connected to signal ground 324, is selected to be 36.5 k ohms (five percent tolerance). This results in a non-inverting gain of approximately eleven. The combination of the series resistor 208 coupled with diodes 210 and 212, connected to signal ground 324, provide voltage limiting capability. In one preferred embodiment, the value of the series resistor 208 is selected to be 10.5 k ohms (five percent tolerance) and the diodes 210 and 212 as 2N3904 NPN general purpose amplifier transistors, manufactured by Fairchild Semiconductor Corporation, South Portland, Me.

The phase locked loop 110 generates a clock signal 112 that maintains a frequency in proportion to that of the amplified drive sense signal 108 received from operational amplifier 202. In one preferred embodiment, the phase locked loop 110 preferably consists of a low power phase locked loop 214 similar to the CD4046, manufactured by Fairchild Semiconductor Corporation, South Portland, Me. The phase locked loop 110 is powered by positive supply voltage 326, signal ground 324 and includes input resistors 216 and 218, which adds a bias to the amplified drive sense signal 108 to one half the positive supply voltage 326. The values of resistors 216 and 218 may be selected to limit the amplified drive sense signal 108 at the input of the phase locked loop 110. Frequency of the clock signal 112 at the output of the phase locked loop 110 is determined by the amplified drive sense signal 108 in addition to the control components consisting of resistors 220, 222, which are coupled to signal ground 324, and capacitor 224, connected to the capacitance input of the low power phase locked loop 214. In one preferred embodiment, resistor 220 is selected to be 15 k ohms (ten percent tolerance), resistor 222 is selected to be 100 k ohms (ten percent tolerance) and capacitor 224 is selected to be 680 picofarads (ten percent tolerance). The phase locked loop 110, though preferred to be an integrated circuit with a zero phase error detector, it may be comprised of discreet components with any of a number of configurations. In one alternative embodiment, the count sequence 117 may be offset by encoding an EPROM (erasable programmable read only memory), using additional logic or by reassigning the demultiplexer 270 inputs. This would effectively shift the phase of the substantially bipolar stepped sinusoidal signal 142 as may be required by the actuator and/or the drive sensing system and/or the low pass filter 145.

The clock signal 112 from the phase locked loop 110 is transmitted to a counter 115 that generates a count sequence 117 derived from the drive sense signal 102. In one preferred embodiment, the counter 115 preferably consists of a four bit counter 240 similar to the CD40161, manufactured by Intersil Corporation, Milpitas, Calif. The four bit counter 240 is powered by positive supply voltage 326, negative supply voltage 328 and signal ground 324. The negative supply voltage 328 is decoupled to signal ground 324 through capacitor 246. The counter 115 is further AC coupled by a high pass filter consisting of series capacitor 242 at the clock signal 112 input and resistor 244 coupled to signal ground 324. In one preferred embodiment, capacitor 242 is selected to be 1000 picofarads (ten percent tolerance), resistor 244 is selected to be 200 k ohms (ten percent tolerance) and capacitor 246 is selected to be 0.1 microfarads (ten percent tolerance). The count sequence 117 at the output of the counter 115 preferably consists of four bits based on the output of the four bit counter 240. The most significant bit (MSB) 118 of the four bit counter 240 will toggle each time the count sequence 117 reaches the numbers eight and zero. The MSB 118 of the four bit counter 240 is transmitted back through resistor 226 to the comparator input of the low power phase locked loop 214 to provide a phase reference for tracking the phase of the clock signal 112 to the drive sense signal 102 as it is received by the phase locked loop 110. This signal is further pulled up to positive supply voltage 326 through resistor 228. The MSB 118 of the four bit counter 240 is also transmitted to the demodulator 125. In one preferred embodiment, resistors 228 and 226 are matched values of 20.5 k ohms (five percent tolerance).

The phase feedback 120 receives the phase information signal 111 from the phase locked loop 214 and provides a phase tracking signal 122 through filtering and fine tuning of the phase information signal 111 that is fed back as part of the tracking feature of the phase locked loop 110. The phase information signal 111 is preferably transmitted through the filter network consisting of resistor 230 and capacitor 232, resulting in an integration function to produce a phase signal (phase tracking signal 122) that is transmitted to the frequency input of phase locked loop 214. The filter has a fast portion, consisting of resistor 230 and capacitor 232, and a slow portion, consisting of resistor 236 and capacitor 234. Diode 238 is used to discharge the capacitors at power down. This allows the system to power up with an initial frequency at the low end of the range, In one preferred embodiment, the following values are to be selected: resistor 230 is 220 k ohms (ten percent tolerance), resistor 236 is 33.2 k ohms (five percent tolerance), capacitor 232 is 47 picofarads (ten percent tolerance), capacitor 234 is 0.1 microfarads (ten percent tolerance), and diode 238 is a 1 N4148.

A demodulator 125 receives the drive sense signal 102, similarly as transmitted to the drive amp 105 and includes an operational amplifier 248 that is preferably a high-impedance, low signal noise matched amplifier set similar to the TLC2274, manufactured by Texas Instruments, Dallas, Tex. The values of resistors 252, 254 and 256 may be selected to produce the desired gain of the operational amplifier 248. In one preferred embodiment, the values of all three resistors are matched values of 20.5 k ohms (five percent tolerance) to attain unity gain. Dual supply voltages are utilized to accommodate both positive and negative signal swing and in one preferred embodiment include positive supply voltage 326 and negative supply voltage 328. Decoupling is provided through capacitor 258 to signal ground 324. The demodulator 125 is further controlled by the MSB 118 from the four bit counter 240, which is transmitted through capacitor 272 and resistor 274 and applied to the gate of switching transistor 250. The signal applied to the gate of transistor 250 is further pulled down to the negative supply voltage 328 through resistor 276. The switching transistor 250 is preferably connected such that the source is connected to the non-inverting input of operational amplifier 248 and the sink is connected to signal ground 324. The drive sense signal 102 is transmitted through operational amplifier 248 via resistors 252 and 254 while the MSB 118 toggles the operational amplifier 248 from inverting (negative gain of one) to non-inverting (positive gain of one) modes. This produces a negative rectified sine wave signal 127 which is transmitted to the integrator 135. In one preferred embodiment, the following values are to be selected: resistors 252, 254 and 256 are matched at 20.5 k ohms (five percent tolerance), capacitor 258 is 0.1 microfarads (ten percent tolerance), and switching transistor 250 is similar to the 2N5459 N-channel switching transistor, manufactured by Fairchild Semiconductor Corporation, South Portland, Me. The demodulator 125 may alternatively consist of a simple analog multiplier.

An integrator 135 receives the negative rectified sine wave signal 127 from the demodulator 125 through series resistor 262, which is transmitted to the inverting input of operational amplifier 260. Within the feedback loop of the operational amplifier 260 is capacitor 264, which is selected in combination with resistor 262 to determine the response time of the integrator 135. A reference 130 includes a low pass filter consisting of resistor 266 and capacitor 268, which is connected to the non-inverting input of operational amplifier 260. Resistor 266 is further connected to a negative reference voltage 330 and capacitor 268 which is coupled to signal ground 324. Negative voltage reference 330 provides a voltage which is subtracted from the negative rectified sine wave signal 127 and the difference represents the amount of error margin to be corrected by the integrator 135. In the event that the negative rectified sine wave signal 127 is less than the reference 130, the integrator output will drift more positive. In the event that the negative rectified sine wave signal 127 is equal to the reference 130, the integrator output will hold its value. In the event that the rectified positive wave signal 127 is more than the reference 130, the integrator output will drift more negative The integrator 135 produces a substantially constant signal 137, when the system is at equilibrium which is transmitted to the input of a multiplying digital to analog converter (D/A) 140, acting as the multiplying reference for the D/A 140. In one preferred embodiment, the following values are to be selected: resistors 262 and 266 are matched at 1.00 M ohms (one percent tolerance), capacitor 264 is 3300 picofarads (ten percent tolerance), capacitor 268 is 0.01 microfarads (ten percent tolerance) and operational amplifier 260 is preferably a high-impedance, low signal noise matched amplifier set similar to the TLC2274, manufactured by Texas Instruments, Dallas, Tex. The integrator 135 may alternatively consist of a capacitor fed by a current source, as is known in the art.

The D/A 140 receives the substantially constant signal 137 from the integrator 135. The D/A 140 consists of a sixteen channel demultiplexer 270, a resistor ladder configuration consisting of resistors 282, 284, 286, 288, 290, 292, 296 and 298, with operational amplifier 294, which produces a substantially bipolar stepped sinusoidal signal 142 that is transmitted to a low pass filter 145. The bipolar stepped sinusoidal signal 142 is equal in magnitude but opposite in polarity to substantially constant signal 137. The D/A 140 is functioning as sixteen bit analog switch with the resistor ladder controlling the voltage states. Alternatively, the resistor ladder configuration may be replaced by a memory map (ROM map) consisting of a sine wave that is sequenced by a four bit counter subsequently processed by a standard multiplying D/A converter. It is the coupling of the sixteen inputs of the demultiplexer 270 to complementary bits (Y0 to Y15, Y1 to Y14, etc) and utilizing the operational amplifier 294 as an integration function, with feedback capacitor 299, that produces the desired substantially bipolar stepped sinusoidal signal 142. Alternatively, a constant phase offset of any amount may be made by selecting alternative input pairs to the demodulator 125. The D/A 140 may alternatively be a simple D/A with a voltage reference that is varied by an integrator. Other switch configurations may be utilized in place of the D/A 140 for either a higher or lower number of switches, of course increasing the number will produce a smoother signal at the cost of economy. The inverting input of the operational amplifier 294 is connected to signal ground 324. The multiplexer 270 is further controlled by the transmitted count sequence 117 from counter 115. This count sequence 117 determines the selection sequence of the sixteen inputs to be generated at the output of the D/A 140. In one preferred embodiment, the D/A 140 is preferably a sixteen channel CMOS analog demultiplexer similar to the CD4067, manufactured by Texas Instruments, Dallas, Tex. In one preferred embodiment, the following are selected: resistors 282 and 292 are 1.50 k ohms (one percent tolerance), resistors 284 and 290 are 2.74 k ohms (one percent tolerance), resistors 286 and 288 are 3.65 k ohms (one percent tolerance), resistors 296 and 298 are 2.00 k ohms (one percent tolerance), capacitor 299 is 3300 picofarads, and operational amplifier 294 is preferably a high-impedance, low signal noise matched amplifier set similar to the TLC2274, manufactured by Texas Instruments, Dallas, Tex. The supply voltage utilized for demultiplexer 270 consists of positive supply voltage 326, decoupled to signal ground 324 through capacitor 280, and negative supply voltage 328, decoupled to signal ground 324 through capacitor 278. In one preferred embodiment, capacitors 280 and 278 are selected to be 0.1 microfarads (ten percent tolerance).

A low pass filter 145 receives the substantially bipolar stepped sinusoidal signal 142 from the D/A 140 and smoothes the edges of the signal so as to generate a substantially sinusoidal signal 147 that is derived from the drive sense signal 102. This low pass filter 145 produces a relatively small and stable phase shift to the substantially bipolar stepped sinusoidal signal 142 because the steps being smoothed are of a significantly higher frequency than the substantially bipolar stepped sinusoidal signal 142. The low pass filter 145 consists of operational amplifier 300, utilizing a negative supply voltage 328. The gain of operational amplifier 300 may be selected based on the values of feedback resistor 312, connected between the output and the inverting input of the operational amplifier 300, and resistor 310 connected between the inverting input of the operational amplifier 300 and signal ground 324. The resistor and capacitor pairs used for filtering consist of series resistor 302 with feedback capacitor 308 and series resistor 304 with decoupling capacitor 306. The component values of these filter pairs determine the cutoff frequency of the low pass filter 145. In one preferred embodiment, the following values are selected: resistor 310 is 150 k ohms (ten percent tolerance), resistor 312 is 100 k ohms (ten percent tolerance), capacitors 306 and 308 are 100 picofarads (ten percent tolerance), resistors 302 and 304 are 43.2 k ohms (five percent tolerance) and operational amplifier 300 is preferably a high-impedance, low signal noise matched amplifier set similar to the TLC2274, manufactured by Texas Instruments, Dallas, Tex. The low pass filter 145 may be any single or multiple pole configuration sufficient to smooth the signal or, as can be found in the art, an inductor paired with a capacitor.

A driver buffer 150 receives the substantially sinusoidal signal 147 from the low pass filter 145, transmitted through series resistor 316, and further inverts the incoming signal to produce a complementary sinusoidal signal 152. The complementary sinusoidal signal 152 contains substantially the same wave shape as its derived input signal (substantially sinusoidal signal) 147 but phase shifted substantially one hundred and eighty degrees. In one preferred embodiment, the two resulting signals 147 and 152, are used on a vibrating-structure gyro structure, such as a high-Q angular rate sensor (U.S. Pat. No. 6,272,925 B1). In some instances, the driver buffer 150 may not be required when a single phase signal is all that is needed. The driver buffer 150 consists of operational amplifier 314, having a positive supply voltage 326 and negative supply voltage 328 with the non-inverting input connected to signal ground 324. Each of the supply voltages, 326 and 328, are decoupled to signal ground 324 through capacitors 320 and 322 respectively. The gain of the amplifier may be selected based upon the values of the series resistor 316 and feedback resistor 318, connected between the output and inverting input of the operational amplifier 314. In one preferred embodiment, the following values are selected: resistors 318 and 316 are 20.5 k ohms (five percent tolerance), capacitors 320 and 322 are 0.1 microfarads (ten percent tolerance) and operational amplifier 314 is preferably a high-impedance, low signal noise matched amplifier set similar to the TLC2274, manufactured by Texas Instruments, Dallas, Tex.

Figure 3:
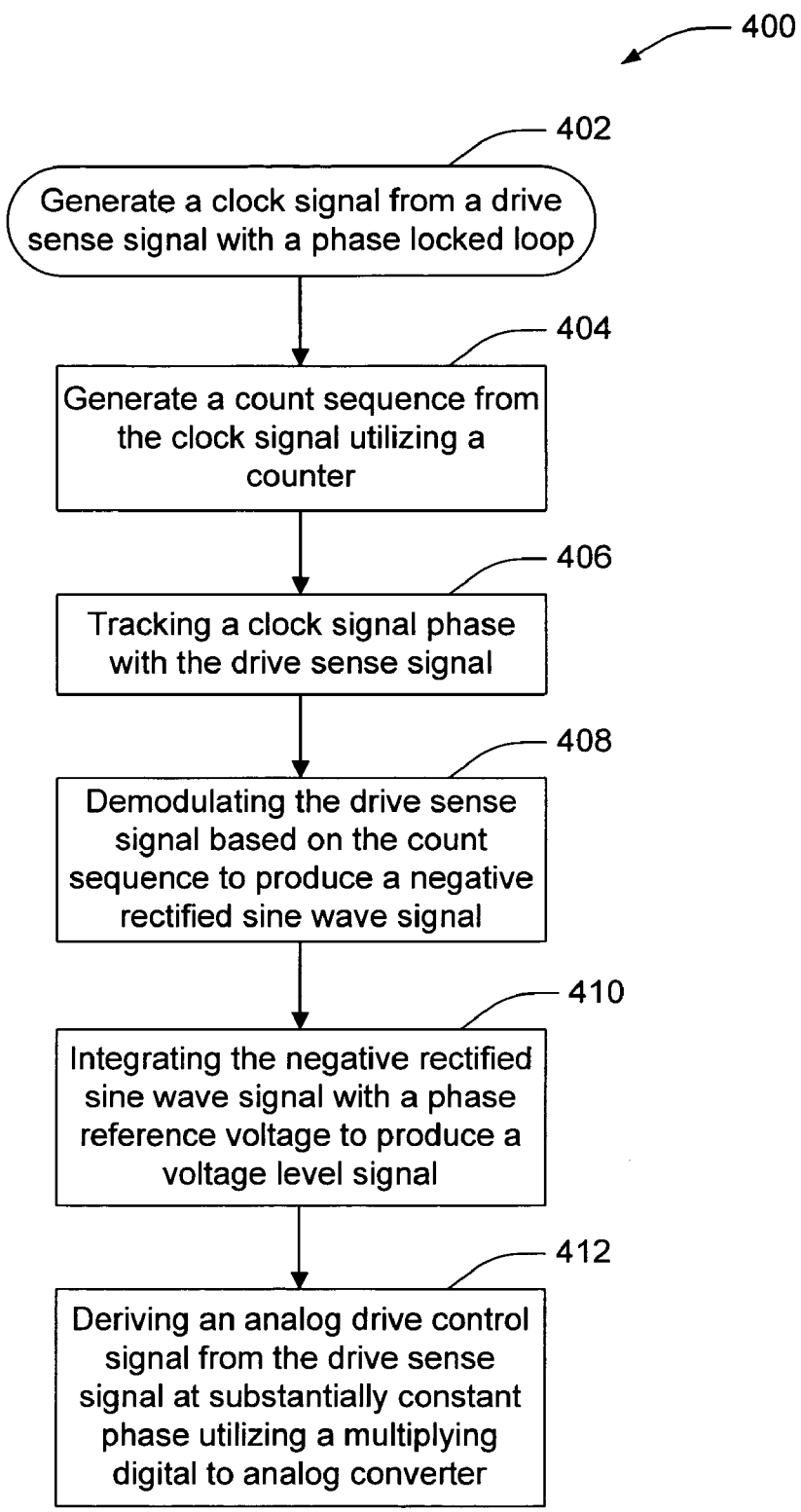
FIG. 3 is a flow diagram of a method of producing the drive control signal utilizing a circuit similar to that illustrated in FIG. 1 and FIG. 2.

FIG. 3 shows a flow diagram 400 illustrating a method of generating a drive signal for energizing an actuator about a natural resonant frequency in accordance with this invention. The clock signal step 402 includes generating a clock signal 112 from a drive sense signal 102 with a phase locked loop 110. The clock signal 112 is subsequently used in the count sequence step 404 to generate a count sequence 117 from the clock signal 112, utilizing a counter 115. One bit 118 is transmitted back to the phase locked loop 110, at tracking step 406, providing phase tracking between the clock signal 112 and the drive sense signal 102. In one preferred embodiment, the phase locked loop 110 includes phase feedback 120 which filters the phase information signal 111 producing a phase tracking signal 122. The filters utilized as part of the phase feedback 120, may include both fast and slow response elements to accommodate a wide range of frequencies and may also establish power up conditions. The demodulating step 408 includes demodulation of the drive sense signal 102 based on the count sequence 117 generated by the counter 115, producing a negative rectified sine wave signal 127. An alternative method of performing the demodulating step 408 may utilize the amplified drive sense signal 108 as an input. Following the demodulating step 408 is the integration step 410. The integration step 410 includes integration of the negative rectified sine wave signal 127 with a phase reference voltage 130 to produce a substantially constant signal 137. The derivation step 412 includes deriving an analog drive control signal 147 from the drive sense signal 102 while utilizing a multiplying digital to analog converter 140 that converts the substantially constant signal 137 to a bipolar stepped sinusoidal signal 142. The bipolar stepped sinusoidal signal 142 is further smoothed by filter 145 to produce the analog drive control signal 147. An alternative embodiment of the filter 145 may include amplification and signal inversion as needed depending upon the polarity needed in the final drive control signal. It should be noted that an alternative method may include additional filtering, similar to filter 145, at earlier stages of the drive control circuit as a means to reduce harmonics and smooth the signal between the various processing steps.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular components such as operational amplifiers may vary by manufacturer, having differing design tolerances, pin-out and packaging. The drive amp 105 may be of a different gain or even eliminated altogether if the drive sense signal 102 is of sufficient size. Additionally, the discrete components such as resistors and capacitors may have a wide range of operating range and tolerances which will affect the results in varying degrees. The particular components may be selected depending on the particular application for the gain control circuit while maintaining substantially the same functionality without departing from the scope and spirit of the present invention. For example, it can be appreciated by those familiar with the art, that the four bit counter (counter 115) is not required but instead may include a two bit counter to provide a variety of phase output signals. In addition, although the preferred embodiment described herein is directed to a drive control circuit for vibrating actuator mass systems, it will be appreciated by those skilled in the art that the teachings of the present invention can be applied to other systems, like gyroscopic instrumentation, various drive control systems, audio signal sources, ultrasonics, and power converters without departing from the scope and spirit of the present invention.

What is claimed is:

1. A drive circuit apparatus for use in generating a drive signal for energizing an actuator about a natural resonant frequency, the drive circuit apparatus comprising: a counter module operatively configured to generate a count sequence derived from a drive sense signal; a demodulator module operatively coupled to the counter module and configured to generate a voltage level signal from the drive sense signal based on the count sequence; and a digital to analog converter module operatively coupled to the counter and demodulator modules and configured to generate the drive signal at substantially constant phase with the drive sense signal derived from the voltage level signal and based on the count sequence.

2. The drive circuit apparatus of claim 1 wherein the counter module comprises a phase locked loop that generates a clock signal from the drive sense signal.

3. The drive circuit apparatus of claim 2 wherein the counter module further comprises a four bit counter that generates the count sequence from the clock signal.

4. The drive circuit apparatus of claim 2 wherein the counter module further comprises a phase feedback that tracks a clock signal phase of the phase locked loop with the drive sense signal.

5. The drive circuit apparatus of claim 1 wherein the drive sense signal of the counter module is amplified.

6. The drive circuit apparatus of claim 1 wherein the demodulator module comprises a demodulator that generates a negative rectified sine wave signal from the drive sense signal based on the count sequence.

7. The drive circuit apparatus of claim 6 wherein the demodulator module further comprises an integrator that generates a substantially constant signal from the negative rectified sine wave signal based on the phase reference voltage.

8. The drive circuit apparatus of claim 1 wherein the digital to analog converter module comprises a multiplying digital to analog converter that generates an analog drive control signal as derived from the drive sense signal.

9. The drive circuit apparatus of claim 8 wherein the digital to analog converter module further comprises a low pass filter that generates a filtered analog drive control signal.

10. The drive circuit apparatus of claim 9 wherein the digital to analog converter module further comprises a non-inverting amplifier that generates a first drive signal from the filtered analog drive control signal.

11. The drive circuit apparatus of claim 10 wherein the digital to analog converter module further comprises an inverting amplifier that generates a second drive signal from the first drive signal.

12. A drive circuit apparatus for energizing an actuator about a natural resonant frequency, the drive circuit apparatus comprising: a counter configured to generate a count sequence from a received clock signal derived from a drive sense signal; demodulator means, operatively coupled to the counter as a phase reference, for generating a demodulated drive sense signal in proportion to the received drive sense signal; integrator means, operatively coupled to the demodulator means and a reference voltage, for offsetting the demodulated drive sense signal such that the sum of the demodulator means and reference voltage is integrated to a substantially constant signal; multiplying digital to analog converter means, operatively coupled to the integrator means and the counter, for generating a substantially bipolar stepped sinusoidal signal, the converter means having a filter and phase adjustor that generates a substantially smooth sinusoidal signal from the substantially bipolar stepped sinusoidal signal.

13. The drive circuit apparatus of claim 12 further comprising a signal buffer means, operatively coupled to the converter means, for generating a first and second drive signal from the substantially smooth sinusoidal signal, the first drive signal being phase shifted substantially one hundred eighty degrees from the second drive signal.

14. A method of generating a drive signal for energizing the actuator about a natural resonant frquency, comprising:

generating a count sequence derived from a drive sense signal;

generating a voltage level signal from the drive sense signal based on the count sequence;

deriving a drive signal at substantially constant phase with the drive sense signal from the voltage level signal and based on the count sequence; and tracking a clock signal phase with the drive sense signal, wherein the generating count sequence step comprises generating a clock signal from the drive sense signal with a phase locked loop and subsequently generating a count sequence from the clock signal utilizing a counter.

15. A method of generating a drive signal for energizing an actuator about a natural resonant frequency, comprising generating a count sequence derived from a drive sense signal;

generating a voltage level signal from the drive sense signal based on the count sequence;

deriving a drive signal at substantially constant phase with the drive signal from the voltage level signal and based on the count sequence; and demodulating the drive sense signal based on the count sequence to produce a negative rectified sine wave signal.

16. The method of claim 15 further comprising a step of integrating the negative rectified sine wave signal with a phase reference voltage to produce a voltage level signal.

17. The method of claim 16 further comprising a step of deriving an analog drive control signal from the drive sense signal utilizing a multiplying digital to analog converter.

* * * * *